United States Patent
Rosenbauer et al.

(10) Patent No.: US 8,197,610 B2
(45) Date of Patent: Jun. 12, 2012

(54) ELECTRIC INTERFACE FOR WATER-BEARING HOUSEHOLD DEVICES

(75) Inventors: Michael Rosenbauer, Reimlingen (DE); Martin Stickel, Giengen (DE)

(73) Assignee: BSH Bosch und Siemens Hausgeraete GmbH, Munich (DE)

( * ) Notice: Subject to any disclaimer, the term of this patent is extended or adjusted under 35 U.S.C. 154(b) by 1084 days.

(21) Appl. No.: 10/583,700

(22) PCT Filed: Dec. 10, 2004

(86) PCT No.: PCT/EP2004/053395
§ 371 (c)(1),
(2), (4) Date: Apr. 4, 2007

(87) PCT Pub. No.: WO2005/061776
PCT Pub. Date: Jul. 7, 2005

(65) Prior Publication Data
US 2008/0121832 A1    May 29, 2008

(30) Foreign Application Priority Data
Dec. 22, 2003  (DE) .................................. 103 60 559
Apr. 21, 2004  (DE) .......................... 10 2004 019 343

(51) Int. Cl.
  *B08B 3/00*  (2006.01)
  *D06F 33/02* (2006.01)
  *D06F 39/08* (2006.01)
(52) U.S. Cl. ................ 134/58 R; 251/129.15; 134/56 R
(58) Field of Classification Search .................. 134/58 R
See application file for complete search history.

(56) References Cited

U.S. PATENT DOCUMENTS

| | | | | |
|---|---|---|---|---|
| 5,873,518 A | * | 2/1999 | Richmond et al. | 236/12.12 |
| 6,319,015 B1 | * | 11/2001 | Faunce | 439/37 |
| 2004/0140677 A1 | * | 7/2004 | Hengelein et al. | 292/201 |
| 2005/0106924 A1 | * | 5/2005 | Roese | 439/352 |

FOREIGN PATENT DOCUMENTS

| | | |
|---|---|---|
| DE | 26 14 053 | 10/1977 |
| EP | 0 585 692 | 3/1994 |
| EP | 0 860 535 | 8/1998 |
| JP | 7-289782 | 11/1995 |

OTHER PUBLICATIONS
International Search Report PCT/EP2004/053395.
* cited by examiner

*Primary Examiner* — Michael Kornakov
*Assistant Examiner* — Katelyn Whatley
(74) *Attorney, Agent, or Firm* — James E. Howard; Andre Pallapies

(57) ABSTRACT

An electric interface for water-bearing household devices is provided comprising a program control for economically controlling, in a flexible and modular arrangement, hydraulic and electrical components which are required for the operational control of the water-bearing household device. At least one part of the electronic components and the magnetic valve is integrated into a component group that is connected to the program control of the water-bearing device. The necessary electric connections are reduced between the individual magnetic valves and the program control due to the integration of hydraulic magnetic valves with electronic components that are used to control the magnetic valves in a component group. The complexity of the cable form for the electric connection of the hydraulic component and the electronic components is reduced, thus enabling modular construction of the related components. The equipment of the component groups can be varied according to each household device design.

10 Claims, 3 Drawing Sheets

ELECTRIC INTERFACE FOR WATER-BEARING HOUSEHOLD DEVICES

The invention relates to an electric interface for water-bearing household devices, such as dishwashers or washing machines. The present invention particularly relates to an electric interface for economical arrangement of hydraulic, mechanical and electric components required for operational control of the water-bearing household appliance.

It is known to use electrically controllable magnetic valves in water-bearing household devices to regulate hydraulic circuits such as, for example, the washing or rinsing liquid circuit. In this case, the magnetic valves are frequently connected directly to the hydraulic circuits to be controlled, by being built into the water-bearing components. The magnetic valves are usually controlled by an operating or program control of the water-bearing household device by means of mechanical or electronic control elements.

It is further known to use sensors in the dishwasher to detect hydraulic parameters and parameters relevant to the washing result. The magnetic valves and sensors are connected to the program control which is usually located at another location in the dishwasher, by means of a cable form and plug contacts which are additionally required, to appropriately control the magnetic valves and sensors according to the operating sequence. The known operating controls have the disadvantage that each magnetic valve and each sensor must be separately connected to the program control. Since the positioning of the magnetic valves and sensors in the hydraulic circuits is dependent of the hydraulic or component-specific circumstances of the water-bearing household device, the contacting of the electronic, hydraulic and mechanical components of the operating control must be made by means of a widely branching cable form. A flexible and modular structure of the components required for the operating control is thereby impossible.

It is the object of the invention to provide an electric interface for water-bearing household devices which allows a flexible and modular arrangement of the hydraulic and electronic components required for the operational control of the water-bearing household device from economical aspects.

This object is achieved by the dishwasher according to the invention having the features according to claim 1. Advantageous further developments of the invention are characterised in the dependent claims 2 to 12.

The present invention provides an electric interface for water-bearing household devices comprising a program control and electronic components for controlling at least one magnetic valve for regulating a liquid line, wherein at least one part of the electronic components and the magnetic valve are integrated into a component group which is connected to the program control.

By integrating hydraulic magnetic valves together with electronic components required to control the magnetic valves in a component group which is connected to the program control of the water-bearing household device, the advantage is achieved that the necessary electrical connections between the program control, the individual magnetic valves and the electronic components for controlling the magnetic valves are reduced. With the interface according to the invention, magnetic valves or control elements are integrated and thus a modular interface is achieved between the hydraulic and the electronic area in a component group. As a result, the complexity of the cable form for the electrical connection of the hydraulic and electronic components is reduced on the one hand and on the other hand, it is possible to have a modular structure of the relevant components.

In a preferred embodiment of the present invention, additionally at least one sensor for detecting parameters relevant for regulating the liquid line, especially hydraulic parameters, is integrated in the component group and passes these on to the preferably electronic program control. Especially important for the program control are hydraulic parameters, such as the quantity of liquid conveyed in the liquid line, for example. As a result of the sensors being integrated in the component group, the hydraulic parameters determined by the sensors can also be transmitted directly to the electronic components accommodated in the same component group for controlling the magnetic valves.

The liquid line regulated by the magnetic valves can for example be the fresh water supply of a water-bearing household machine, the washing liquid circuit of a washing machine or a rinsing liquid circuit of a dishwasher. It is especially advantageous if a number of magnetic valves for regulating a plurality of liquid lines, e.g. the fresh water supply and the washing or rinsing liquid line, are integrated in the component group. As a result of integrating magnetic valves, electronic components and sensors in a component group, the modular structure of the relevant components can be further improved since these are preassembled in a component group and can be used as a unit in the water-bearing household machine.

More appropriately the electronic components for controlling the magnetic valves comprise at least one microprocessor which, for example, is capable of processing measured values relating to the hydraulic parameters delivered by the sensors and calculating the required control signals for the magnetic valves in agreement with the program control of the household machine. In order to connect the component group to the program control of the water-bearing household device, at least one electrical connection is provided on the component group which is preferably embodied as a group plug with a number of electrical contacts. In this way, the electronic connection between the component group and the program control can be accomplished with only one plug which facilitates mounting or exchange of the component group.

In a further preferred embodiment of the present invention, the electric interface comprises a plug-in board which can be plugged with an electric connection into a complementarily configured slot provided for this purpose in the household machine. For this purpose, a section at the edge of the board is preferably constructed as an electric connection with a plurality of electrical contacts. With this section at the edge of the board, the component group can rapidly and simply be inserted into a complementarily configured slot provided for this purpose in the dishwasher during assembly.

The modular structure of the water-bearing household machine is especially promoted if the magnetic valves, the electronic components and preferably also the sensors of the electric interface are disposed on the board. As a result, the required hydraulic, sensing and electronic components can be pre-assembled in a component group and inserted into the household machine according to the design of the water-bearing household machine.

It is especially advantageous if the magnetic valves and/or the sensors are arranged on one or more connectors which are connected to the board by means of electrical leads. Such a connector allows the precise arrangement of one or more magnetic valves or sensors and the contacting of the same. As required, the interface according to the invention can be fitted with more or fewer magnetic valves or sensors by a simple plug arrangement. For this purpose, the connector for the magnetic valves and/or the sensors is fitted with a number of slots which are used for electric contacting of the magnetic valves and/or the sensors.

In a further preferred embodiment of the present invention, the connector is arranged on the board of the electric interface which also carries the electronic components for controlling the magnetic valves and sensors so that an inherently closed control and regulating module is formed which can preferably be connected by a single plug directly to the control module or directly to the program control of the household machine. Depending on the design and embodiment of the household machine, the equipment of the component group of the interface according to the invention can be varied by appropriately loading the connectors. In order to provide a reliable arrangement of magnetic valves and sensors on the connector, the slots can have means for mechanical location of the magnetic valves and/or the sensors or for their electrical connections.

The present invention is explained in detail hereinafter using a preferred exemplary embodiment with reference to the appended drawings.

The electric interface according to the invention is used for functional connection between hydraulic and electronic components of a water-bearing household machine, fitted with a preferably electric program control. In the embodiment shown in FIG. 1, the electric interface comprises a board 1 on which a plurality of magnetic valves 2 are arranged for regulating liquid lines (not shown) in a water-bearing household machine. Electronic components 6 for controlling the magnetic valves 2 are also located on the board 1. The magnetic valves 2 can be controlled by the program control of the household machine via the electronic components 6 such that they open or close the relevant liquid line or only allow a throttled flow of liquid. The magnetic valves 2 can regulate, for example, the fresh water supply of a household machine, the washing liquid cycle or a washing machine or the rinsing liquid cycle of a dishwasher.

Figure 1:
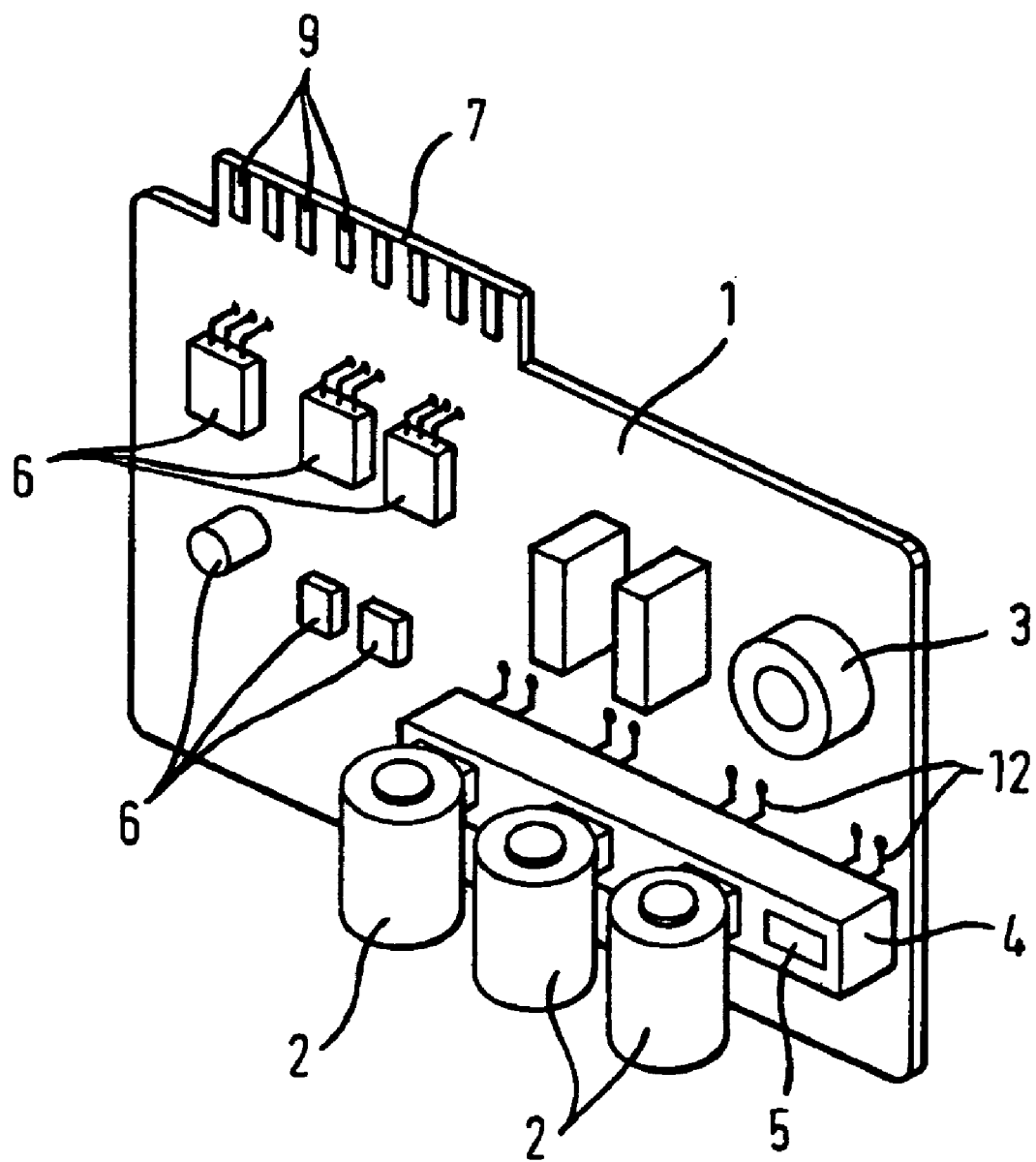
FIG. 1 is a perspective view of an electric interface according to a preferred embodiment of the present invention.

Also located on the board 1 of the interface shown in FIG. 1 is a sensor 3 which. detects parameters relevant to the regulation of the liquid line, such as the quantity of liquid conveyed in the liquid line, for example, and transmits a corresponding signal to the program control of the household machine. As a result of the sensor being integrated in the component group on the board 1, the hydraulic parameters determined by the sensor 3 can also be transmitted directly to the electronic component 6 disposed on the board 1 for controlling the magnetic valves 2. In this way, the electronic components 6, the magnetic valves 2 and the sensors 3 are integrated to form a component group. The electric connections required between the program control, the individual magnetic valves 2, the electronic components 6 for controlling the magnetic valves and the sensing components 3 is thereby reduced.

A section at the edge of the board 1 is constructed as an electrical connection comprising a number of electrical contacts 9 for connecting the component group on the board 1 to the program control of the water-bearing household device. The electrical connection between the component group on the board 1 and the program control can be made via the electrical connection 7 using only one plug which facilitates mounting or exchange of the component group.

Figure 2:
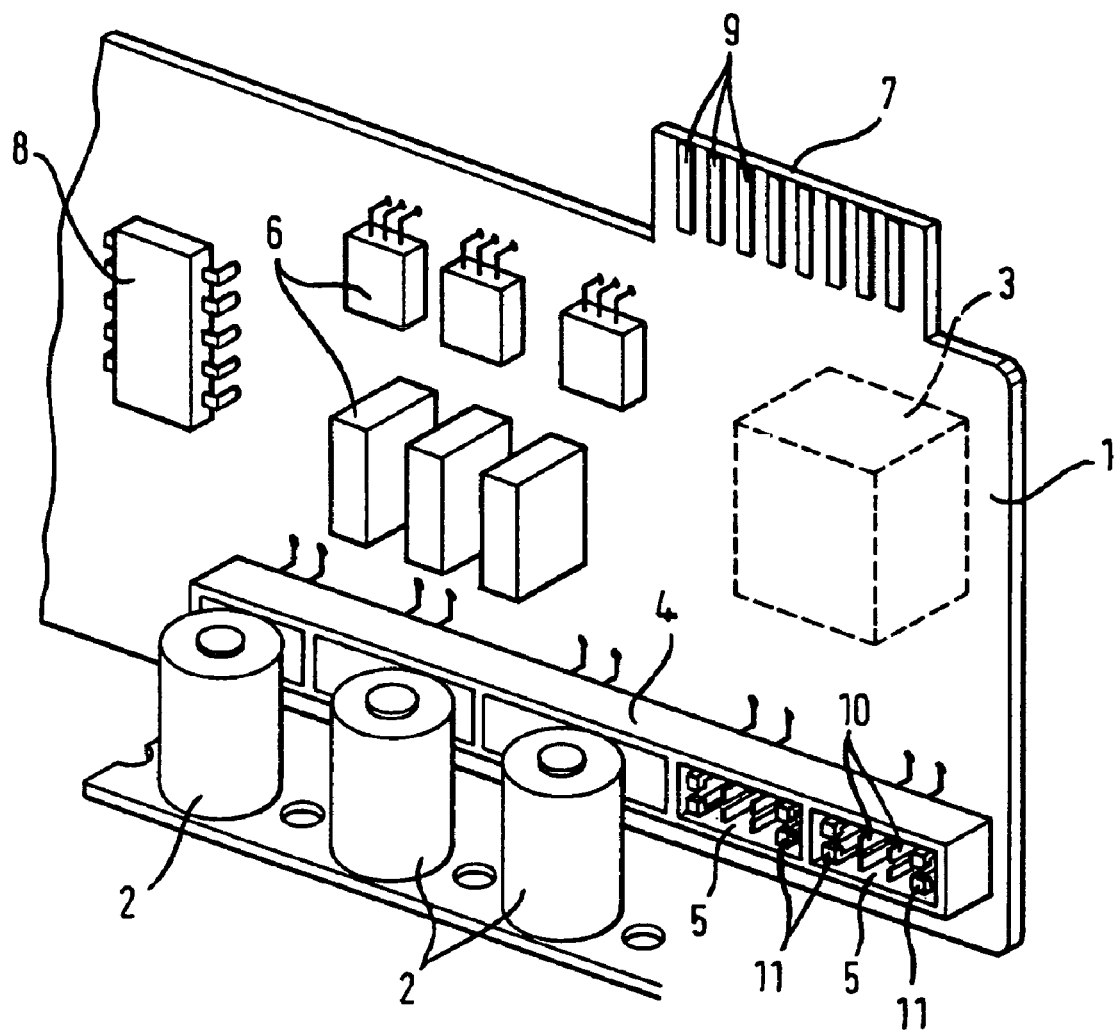
FIG. 2 is a perspective view of the electric interface shown in FIG. 1 according to a preferred embodiment of the present invention.

FIG. 2 shows a perspective view of the electric interface according to a preferred embodiment of the present invention shown in FIG. 1. It can be deduced from FIG. 2 that the electronic components 6 for controlling the magnetic valves 2 comprise at least one microprocessor 8 which is capable of processing the measured values relating to the hydraulic parameters delivered by the sensor 3 and calculating the required control signals for the magnetic valves 2 in agreement with the program control of the household machine.

In the embodiment of the present invention shown in FIGS. 1 and 2, the electric interface is constructed as a plug-in board 1 so that the electric connection 7 at the edge of the board 1 can be plugged into a complementarily constructed slot provided for this purpose in the household machine. The magnetic valves 2 are arranged on a connector 4 which is connected to the board 1 via electrical leads 12. The connector 4 has a number of slots 5 into which the magnetic valves 2 or their electrical connections can be plugged. As a result, the required number of magnetic valves 2 can be pre-assembled on the connector 4 according to the design of the water-bearing household machine and inserted into the household machine. The slots 5 are each fitted with electrical contacts 10 for electrical contacting, and with mechanical locating means 11 for mechanical locking, of the magnetic valves 2, which will be discussed in further detail in the description to FIG. 3. Consequently, the board 1 can be loaded quickly and easily with the required magnetic valves 2 and thus a clear and reliable arrangement and contacting of the magnetic valves 2 is achieved.

The arrangement of the hydraulic, sensing and electronic components 2, 3, 6, 8 for controlling the magnetic valves in a component group on the board 1 of the interface according to the invention results in an inherently closed control and regulating module. Depending on the design and embodiment of the household machine, the equipment of the component group of the interface according to the invention can be varied by suitably loading the board 1 and the connector 4. The complexity of the cable form for the electrical connection of the hydraulic, sensing and electronic components is thus reduced with the interface according to the invention, promoting a modular structure of the relevant household machine.

Figure 3:
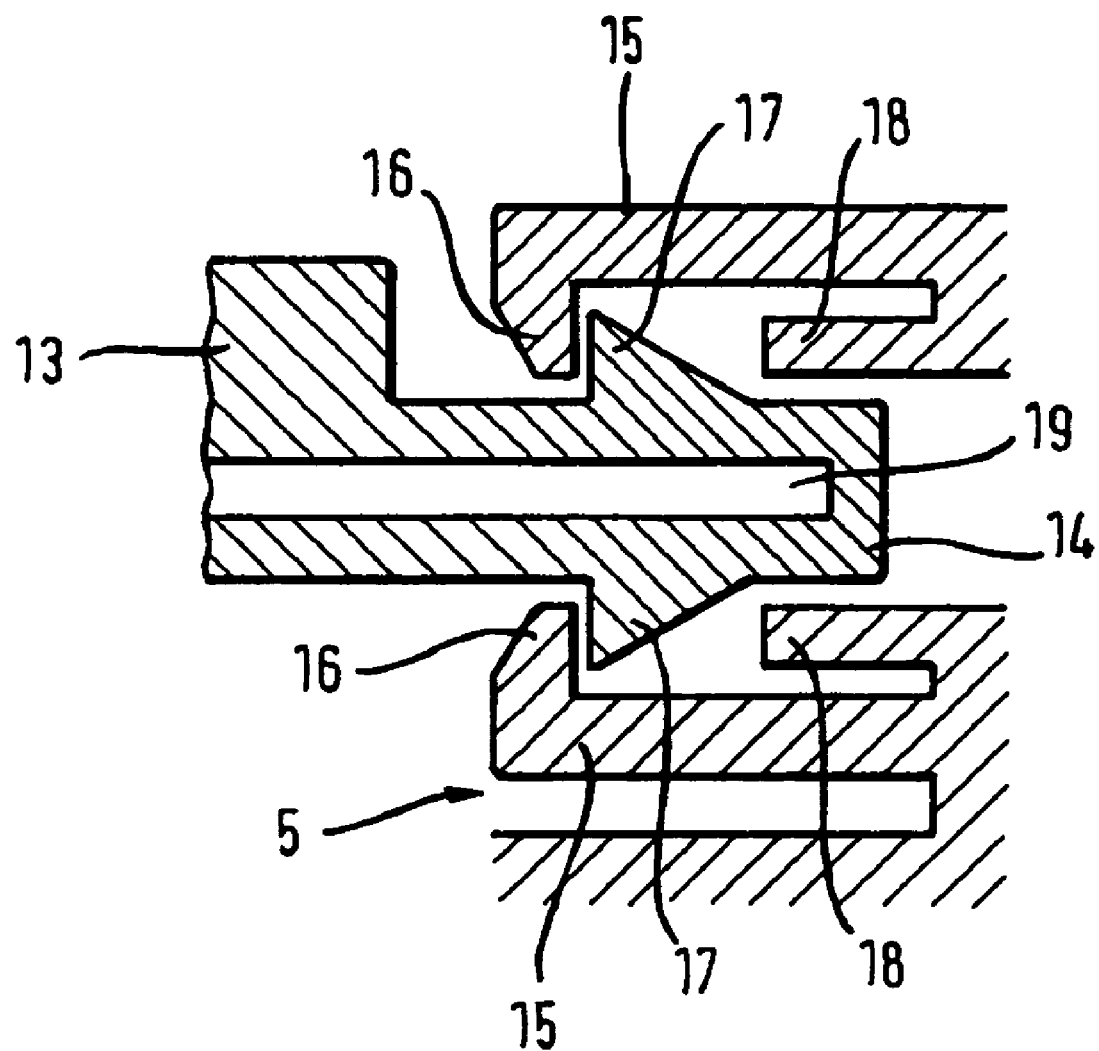
FIG. 3 is a sectional view through a plug connection making electrical contact between the interface according to the invention and a magnetic valve or a sensor.

The connector 4 can also be provided to receive a magnetic valve 2 or a sensor 3 in its slots 5. FIG. 3 shows a sectional view through a plug connection for making electrical contact between the interface according to the invention and a magnetic valve 2 or a sensor 3. FIG. 3 shows a cross section through a slot 5 of the connector 4 in which the electrical connection 13 of a magnetic valve 2 or sensor 3 is inserted and is located in the lock-in position. The slot 5 has two symmetrically opposed locating means, each constructed as elastic spring-mounted snap hooks 15 having an internally directed projection 16 at their free end. The electrical connection of the magnetic valve 2 or the sensor 3 has symmetrically arranged flanks 17 which grip behind the projections 16 of the spring-mounted snap hooks 15 in the lock-in position and thus produce engagement between the slot 5 and the electrical connection 13 of the magnetic valve 2 or the sensor 3.

The flanks 17 of the electrical connection 13 have an upwardly sloping surface on the side directed towards the tip 14 so that during the insertion movement of the electrical connection 13 into the slot 5, the elastic spring-mounted snap hooks 15 are pressed outwards and snap in behind the flank 17 in the lock-in position. The tip 14 of the electrical connection 13 is brought into the desired contact position by guide aids 18 during the insertion movement and is held there in the lock-in position. Formed at the center of the electrical connection 13 is a channel 19 in which the electrical leads run and make the electrical connection to the tip 5 and therefore to the electric interface in the lock-in position.

REFERENCE LIST

1 Board of interface
2 Magnetic valve
3 Sensor
4 Connector for magnetic valve 2
5 Slot on connector 4
6 Electronic components
7 Electrical connection of board 1
8 Microprocessor
9 Contacts of electrical connection 7
10 Contact pins of slots 5
11 Mechanical locating means of slots 5
12 Electrical leads to connector 4
13 Electrical connection of magnetic valve 2 or sensor 3
14 Tip of electrical connection 13
15 Snap hooks of slot 5
16 Projections on snap hook 15
17 Flanks
18 Guide aids at slot 5
19 Channel for electrical leads

The invention claimed is:

1. An electric interface for water-bearing household devices comprising:
    an electronic circuit board for operatively mounting to the water-bearing household device;
    a program control;
    at least one magnetic valve mounted to the circuit board in fluid communication with a liquid line of the water-bearing household appliance for controlling the flow of liquid therethrough; and
    at least one electronic component for controlling the at least one magnetic valve with the at least one electronic component being a valve controller embodied in a microprocessor mounted to the circuit board and integrated into a component group that is connected to the program control.

2. The electric interface according to claim 1 and further comprising at least one sensor for detecting parameters applicable to the control of the liquid line including hydraulic parameters and non-hydraulic parameters, the at least one sensor being integrated into the component group and mounted to the circuit board.

3. The electric interface according to claim 1, wherein the liquid line is a selected one of a fresh water supply of a water-bearing household machine, a rinsing liquid circuit of a washing machine, and a washing liquid circuit of a dishwasher.

4. The electric interface according to claim 1 and further comprising a plurality of magnetic valves for controlling a plurality of liquid lines are integrated in the component group and mounted to the circuit board.

5. The electric interface according to claim 1, wherein at least one electrical connection is provided for the electrical connection of the component group to the program control of the water-bearing household device, the electrical connection being configured as a selected one of a group plug with a number of electrical contacts and a connection that is not a group plug with a number of electrical contacts.

6. The electric interface according to claim 1 wherein the circuit board is configured as a plug-in board that can be plugged with an electric connection into a complementarily configured slot in a household machine.

7. The electric interface according to claim 6, wherein a section at the edge of the plug-in board is configured as an electric connection with a plurality of electrical contacts.

8. The electric interface according to claim 6, wherein at least one of the magnetic valves and the sensors is arranged on at least one connector that is connected to the plug-in board by means of electrical leads.

9. The electric interface according to claim 8 wherein the connector for the at least one magnetic valve or sensor has a plurality of slots operable for electric contacting of the respective magnetic valve or sensor.

10. The electric interface according to claim 9, wherein the slots have means for mechanical location of at least one of the magnetic valves, the sensors, or for their electrical connections.

* * * * *